United States Patent [19]
Yokoyama

[11] Patent Number: 6,124,966
[45] Date of Patent: Sep. 26, 2000

[54] OPTICAL FUNCTIONAL AMPLIFYING METHOD AND OPTICAL FUNCTIONAL AMPLIFYING DEVICE

[75] Inventor: Hiroyuki Yokoyama, Tokyo, Japan

[73] Assignee: NEC Corporation, Tokyo, Japan

[21] Appl. No.: 09/003,883

[22] Filed: Jan. 7, 1998

[30] Foreign Application Priority Data

Jan. 13, 1997 [JP] Japan ..................................... 9-003885

[51] Int. Cl.$^7$ .............................. H01S 3/10; H04B 10/12
[52] U.S. Cl. .......................... 359/339; 359/139; 359/344; 372/11; 372/30
[58] Field of Search ...................... 359/139, 184, 359/186, 336, 339, 344; 250/227.21; 372/11, 25, 30

[56] References Cited

U.S. PATENT DOCUMENTS

| 5,761,228 | 6/1998 | Yano | 372/26 |
| 5,796,765 | 8/1998 | Lucek et al. | 372/25 |
| 5,799,024 | 8/1998 | Bowers et al. | 372/11 |
| 5,844,932 | 12/1998 | Thony et al. | 372/92 |

FOREIGN PATENT DOCUMENTS

| 2235033 | 9/1990 | Japan . |
| 20781093 | 8/1993 | Japan . |
| 6-167732 | 6/1994 | Japan . |

OTHER PUBLICATIONS

Barnsley et al, IEEE Photonics Tech. Lett., vol. 3, #9, pp. 832–834; abst. only herewith, Sep. 1991.

I. Glesk, et al. "Demonstration of all–optical demultiplexing of TDM data at 250 Gbit/s," Electronics Letters, vol. 30, No. 4, pp. 339–341 (Feb. 17, 1994).

*Primary Examiner*—Nelson Moskowitz
*Attorney, Agent, or Firm*—Sughrue, Mion, Zinn, Macpeak & Seas, PLLC

[57] ABSTRACT

An optical functional amplifying device suitable for use in an optical gate which operates at a very high repetition frequency such as a frequency exceeding 100 GHz. The device has a semiconductor laser amplifier having a gain section and a saturable absorber section, a first optical coupler for coupling an input signal optical pulse train having a wavelength whose value is set near the absorption edge of the saturable absorber section in the semiconductor laser amplifier, a second optical coupler for coupling a gate optical pulse train having a wavelength shorter than that of the input signal optical pulse train to the semiconductor laser amplifier, and a selector for separating and extracting a signal optical pulse train emitted from the semiconductor laser amplifier from the gate optical pulse train. The repetition frequency of the gate optical pulse train is set to one N-th the basic frequency of the input signal optical pulse train, N being a natural number, to establish timing synchronization between the gate optical pulse train and the input signal optical pulse train.

18 Claims, 3 Drawing Sheets

OPTICAL FUNCTIONAL AMPLIFYING METHOD AND OPTICAL FUNCTIONAL AMPLIFYING DEVICE

BACKGROUND OF THE INVENTION

1. Field of the Invention

This invention relates to an optical functional amplifying method and an optical functional amplifying device wherein an optical pulse train is controlled using a semiconductor laser amplifier. More particularly, the present invention relates to an optical functional amplifying method and an optical functional amplifying device by which a train of very short optical pulse with a very high repetition rate can be controlled and which is useful for optical communication, optical information processing, optical measurement and so forth.

2. Description of the Prior Art

In recent years, a demand for development of a technique for transmitting and controlling an optical pulse data train having a time width of several ps (picoseconds) or less and a repetition frequency exceeding several tens Gb/s to one hundred Gb/s as a basic technique for very high speed optical communication and optical information processing. Here, b/s represents a pulse amount per one second in units of a bit and 1 Gb/s corresponds to a pulse amount of $10^9$ bits per second.

In such a situation as described above, there is demand to establish, together with production of a stable and coherent optical pulse train, a technique for production of a very high speed optical pulse data train, a technique for dividing and extracting a very high speed optical pulse train and a technique for recovering the waveform of a very high speed optical pulse data train which has been distorted with respect to time during transmission. Of the techniques mentioned, there are available techniques for division and extraction of a very high speed optical pulse data train and for recovery of the waveform requiring gate switches which operate at a very high speed. In an ordinary case, electric control is very difficult due to the restriction in response speed, and therefore, an optical gate which is controlled by an optical pulse has been proposed for such gate switches.

One such optical gates is an interferometer wherein a semiconductor laser amplifier is disposed in an optical path. An interferometer of the type just mentioned is disclosed, for example, in I. Glesk et al., Electron. Lett, 30(4), 339–341 (1994). The thesis recites a result of an experiment wherein an optical data train of 250 Gb/s was divided at the rate of 100 MHz using an optical loop type interferometer called TOAD (Terahertz optical asymmetric demodulation) by which a timeslot of 4 ps was realized.

With such a conventional optical gate employing an interferometer wherein a semiconductor laser amplifier is disposed in an optical path as described above, the operation repetition frequency depends upon the life of carriers in the semiconductor laser, and the gate operation at a repetition frequency exceeding several tens GHz is difficult. Accordingly, the conventional optical gate has a problem in that, while it can be used in an application wherein a gate operation approximately of picoseconds is performed in a comparatively low repetition frequency from a very high speed optical data train, it cannot be used in another application wherein a true very high speed gate operation is performed.

SUMMARY OF THE INVENTION

It is an object of the present invention to provide an optical functional amplifying method which solves the problem of the conventional optical gate described above and is used to realize an optical gate which operates at a repetition frequency exceeding 100 GHz.

It is another object of the present invention to provide an optical functional amplifying device which solves the problem of the conventional optical gate described above and is used to realize an optical gate which operates at a repetition frequency exceeding 100 GHz.

The first object of the present invention is achieved by an optical functional amplifying method, comprising steps of preparing a semiconductor laser amplifier which has a gain section and has a saturable absorber section provided at a portion thereof, coupling an input signal optical pulse train having a wavelength whose value is set in a proximity of an absorption edge of the saturable absorber section and a gate optical pulse train having a wavelength set shorter than the wavelength of the input signal optical pulse train, separating and extracting a signal optical pulse train emitted from the semiconductor laser amplifier from the gate optical pulse train, and establishing timing synchronization between the gate optical pulse train and the input signal optical pulse train with a repetition frequency of the gate optical pulse train set to one N-th a basic frequency of the input signal optical pulse train, N being a natural number.

The second object of the present invention is achieved by an optical functional amplifying device, comprising a semiconductor laser amplifier having a gain section and a saturable absorber section, optical coupling means for coupling an input signal optical pulse train and a gate optical pulse train to the semiconductor laser amplifier, and selection means for separating and extracting a signal optical pulse train emitted from the semiconductor laser amplifier from the gate optical pulse train.

In the optical functional amplifying device, an optical gate operation is realized by constructing the device such that, when an optical pulse of the gate optical pulse train is not inputted thereto, the input signal optical pulse train is absorbed by the saturable absorber section, but when the saturable absorber section is saturated by an optical pulse of the gate optical pulse train, the input signal optical pulse train is amplified by the semiconductor laser amplifier. From the operation principle just described, the optical functional amplifying device of the present invention is preferably constructed such that the saturable absorber section is disposed in the proximity of one end of the semiconductor laser amplifier and the input signal optical pulse train is introduced into the semiconductor laser amplifier from the saturable absorber section side while the gate optical pulse train is introduced into the semiconductor laser amplifier from the gain section side. Where the optical pulse trains are introduced in this manner, a gate optical pulse is first amplified in the gain section and then reaches the saturable absorber section and varies the absorbance ratio of the saturable absorber section. In this instance, an input signal optical pulse introduced into the semiconductor laser amplifier from the opposite direction passes through the saturable absorber section having a thus increased transmittance, and is then amplified in the gain section. The input signal optical pulse passes through the semiconductor laser amplifier in this manner and forms a processed output signal optical pulse train.

In the present invention, in order to realize an optical gate operation at a higher speed, a PIN structure device is used for the semiconductor laser amplifier. The saturable absorber section is formed so as to have a shorter optical path length and is isolated from the gain section by an electrically high resistance. A reverse bias voltage is applied to the saturable absorber section. By the construction just described, optical carriers are swept out efficiently from the saturable absorber section as a result of the application of the reverse bias to the saturable absorber section in the PIN structure. The carriers thus swept out flow rapidly toward a potentially grounded portion through a parasitic capacitance, and accordingly, the life of the carriers is reduced to approximately several picoseconds. Consequently, with the optical functional amplifying device of the present invention, a very high speed optical gate operation at 100 GHz or more becomes possible, and it is possible to effect frequency division and waveform shaping of a very high speed signal optical pulse train at a very high repetition frequency of approximately 100 GHz.

The above and other objects, features and advantages of the present invention will become apparent from the following description based on the accompanying drawings which illustrate examples of preferred embodiments of the present invention.

DESCRIPTION OF THE PREFERRED EMBODIMENTS

Figure 1:
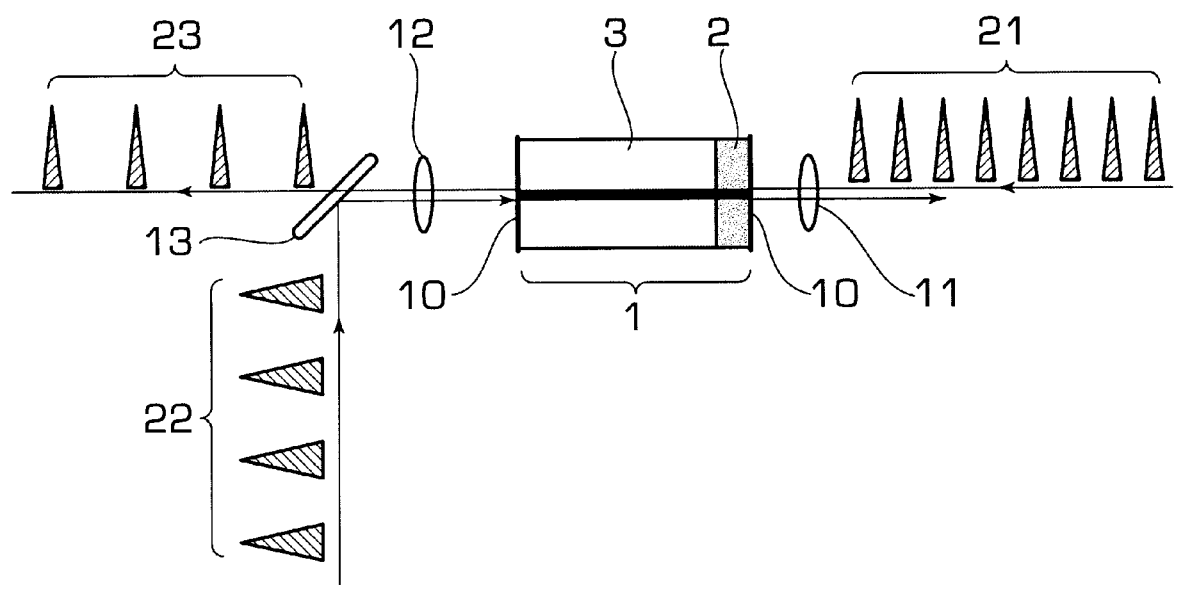
FIG. 1 is a view schematically showing a structure and operation of an optical functional amplifying device of a first embodiment of the present invention.

A semiconductor laser amplifier 1 which is an important component of an optical functional amplifying device of a first embodiment of the present invention is a laser amplifier of the mode synchronization type having a semiconductor optical waveguide structure and has reflection preventing films 10 provided on both end faces of the waveguide structure. Further, the semiconductor laser amplifier 1 has two sections including a saturable absorber section 2 and a gain section 3 which has a larger optical length than the saturable absorber section 2. The saturable absorber section 2 and the gain section 3 are disposed along an optical path direction, but are isolated from each other with a high electric resistance. Here, an active layer of the semiconductor laser amplifier 1 has a PIN structure. Lenses 11 and 12 for coupling light from the outside are disposed in the proximity of the opposite end faces of the semiconductor laser amplifier 1, and a wavelength selector 13 is placed in the proximity of one of the lenses (in the example shown, the lens 12 on the gain section 3 side) such that it is opposed to the corresponding end face of the semiconductor laser amplifier 1 with the lens interposed therebetween. The wavelength selector 13 selects light of a predetermined wavelength from light emitted from the semiconductor laser amplifier 1 and extracts the selected light as an output signal optical pulse train 23.

Figure 2:
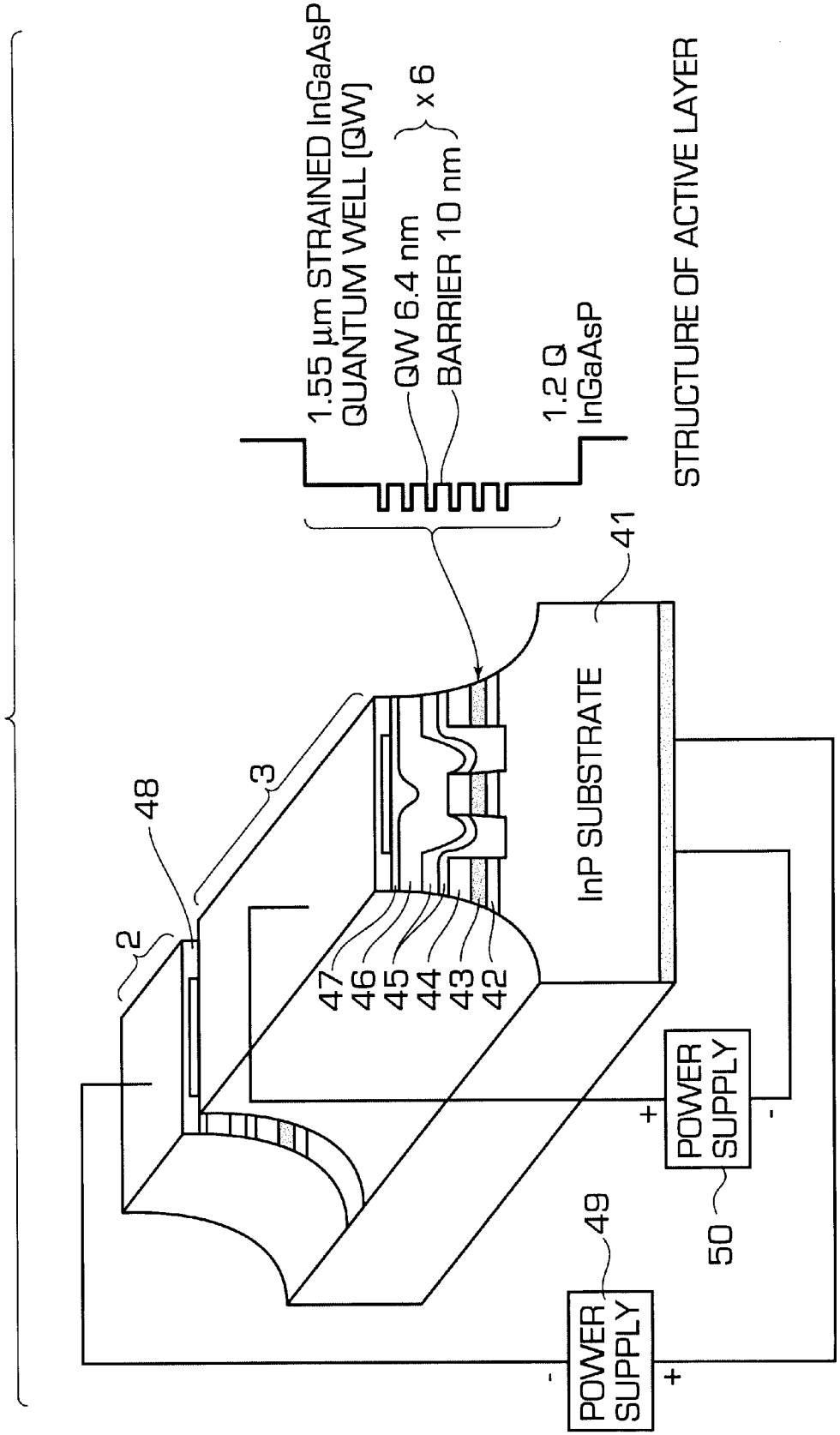
FIG. 2 is a perspective view showing a construction of a semiconductor laser amplifier.

The construction of the semiconductor laser amplifier 1 is described in more detail. Referring to FIG. 2, the semiconductor laser amplifier 1 has a DC-PBH structure (double channeled-planar buried heterostructure) shaped so that a section thereof perpendicular to the optical path direction has a mesa (trapezoidal) shape. For simplified illustration, no reflection preventing film is shown in FIG. 2. An n-type clad layer 42, an active layer 43 and a p-type clad layer 44 are layered on an InP substrate 41, and a blocking layer 45 is disposed on side faces of the n-type clad layer 42, active layer 43 and p-type clad layer 44. Further, a p-type clad layer 46 and a cap layer 47 are disposed on the layers. The active layer 43 of the PIN structure has an InGaAsP quantum well structure wherein six quantum well layers each of 6.4 nm thick and six barrier layers each of 10 nm thick are layered.

The saturable absorber section 2 and the gain section 3 are electrically isolated from each other by layering the layers 42 to 47 on the InP substrate 41 and then forming a groove 48, which extends to the InP substrate 41, from the cap layer 47 side by etching or the like. Here, the terminology "electrically isolated" signifies that active layers in the individual sections are isolated from each other by a high resistivity and bias voltages can be set to them independently of each other. In the present embodiment, a reverse bias can be applied from a power supply 49 to the saturable absorber section 2 while a forward voltage can be applied from another power supply 50 to the gain section 3.

Next, optical switching using the optical functional amplifying device is described.

Forward current is injected to the gain section 3 while a reverse bias is applied to the saturable absorber section 2. In this state, an input signal optical pulse train 21 is coupled to the semiconductor laser amplifier 1 from a side nearer to the saturable absorber section 2 through the lens 11. Further, from the opposite direction (that is, from the gain section 3 side), a gate optical pulse train 22 is coupled to the semiconductor laser amplifier 1 through the wavelength selector 13 and the lens 12. Here, the gate optical pulse train 22 is a clock optical pulse train of a frequency which is one N-th the clock frequency of the input signal optical pulse train 21, N being a natural number. Then, the input signal optical pulse train 21 and the gate optical pulse train 22 have a synchronized relationship with each other at timings in time so that at least some of optical pulses of them may overlap with each other in the saturable absorber section 2 of the semiconductor laser amplifier 1. The wavelength of the input signal optical pulse train 21 has a value which is near the absorption edge of the saturable absorber section 2 which has a semiconductor optical waveguide structure. In other words, the wavelength of the input signal optical pulse train 21 is set in a wavelength region in which the saturable absorber section 2 shows a large abosorbance unless the saturable absorbance section is not saturated in an absorption phenomenon. Meanwhile, the wavelength of the gate optical pulse train 22 is set to the shorter wavelength than the wavelength of the input signal optical pulse train 21. In other words, the wavelength of the gate optical pulse train 22 is set so that the gate optical pulse train 22 can turn the saturable absorber section into a saturated state.

Consequently, the gate optical pulse train 22 amplified by the gain section 3 saturates strong absorption of the saturable absorber section 2, and as a result, the input signal optical pulse train 21 can pass through the gain section 3 only for a certain gate time. After this optical pulse train passes the semiconductor laser amplifier 1, it is separated by the wavelength selector 13 to make an output signal optical pulse train 23. In particular, the input signal optical pulse train 21 is switched in response to the gate optical pulse train 22, and a result of the switching is obtained as the output signal optical pulse train 23.

In the following, the optical functional amplifying device of the first embodiment shown in FIG. 1 is described in connection with a concrete example.

For the semiconductor laser amplifier 1, a semiconductor laser amplifier of an InGaAs/InGaAsP type having a quantum well type semiconductor laser structure was used, and the length of the saturable absorber section 2 was set to 100 μm and the length of the gain section 3 was set to 1,000 μm. For the input signal optical pulse train 21, an optical pulse data train of 200 Gb/s having a center wavelength of 1.55 μm, a pulse half width of 3 ps and an average power of 1 mW was used. Meanwhile, for the gate optical pulse train 22, a clock optical pulse train having a frequency 100 GHz, a center wavelength of 1.54 μm, a pulse half width of 5 ps and an average power of 2 mW was used. In such a construction as described above, by selecting operation conditions of the semiconductor laser amplifier 1 and timings of the input signal optical pulse train 21 and the gate optical pulse train 22 appropriately, an output signal optical pulse train 23 of 100 Gb/s divided to ½ was successfully obtained through a dielectric wavelength filter used as the wavelength selector 13.

Figure 3:
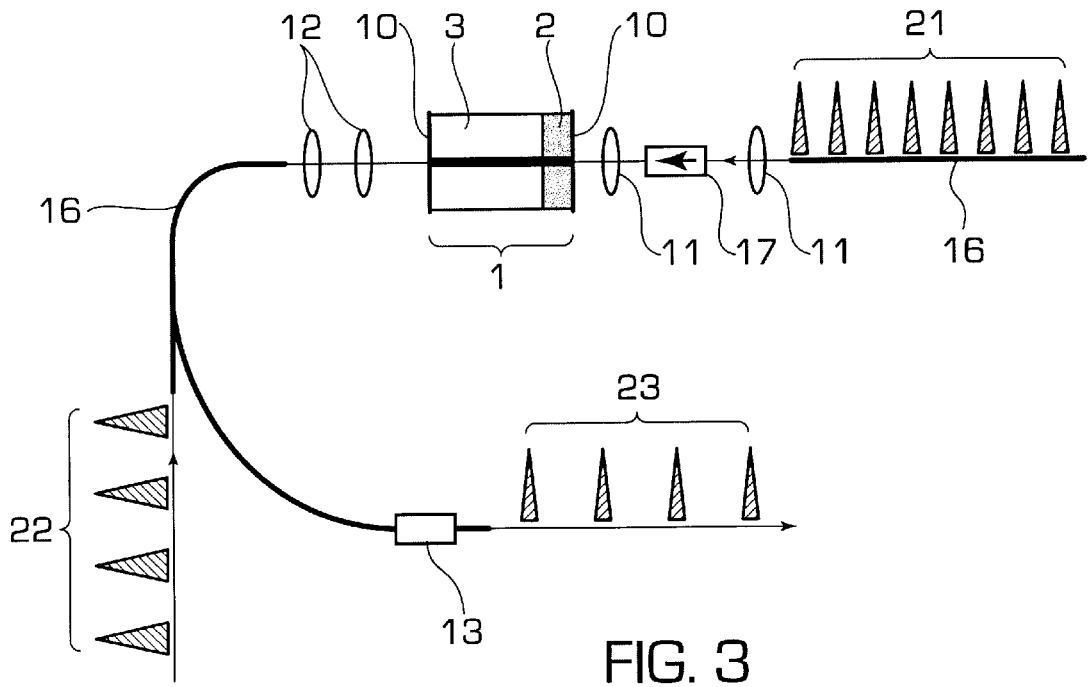
FIG. 3 is a view schematically showing a structure and operation of an optical functional amplifying device of a second embodiment of the present invention.

Next, an optical functional amplifying device of a second embodiment of the present invention is described with reference to FIG. 3. The optical functional amplifying device shown in FIG. 3 has a basically similar construction to that shown in FIG. 1, but has an improved operability by using an optical fiber 16 for each of an input and an output of optical pulse trains to and from the semiconductor laser amplifier 1. The optical fibers 16 and the semiconductor laser amplifier 1 are optically coupled to each other by the lenses 11 and 12. Further, in order to avoid a possible influence of reflection at an end face of an optical fiber upon a resonator, an optical isolator 17 is interposed in an optical path between the end face of the optical fiber 16 on the input signal optical pulse train 21 side and the semiconductor laser amplifier 1. Further, the output signal optical pulse train 23 emitted from the gain section 3 side of the semiconductor laser amplifier 1 is introduced into the wavelength selector 13 via the corresponding optical fiber 16 so that only a predetermined wavelength component of the output signal optical pulse train 23 may be outputted from the wavelength selector 13.

Figure 4:
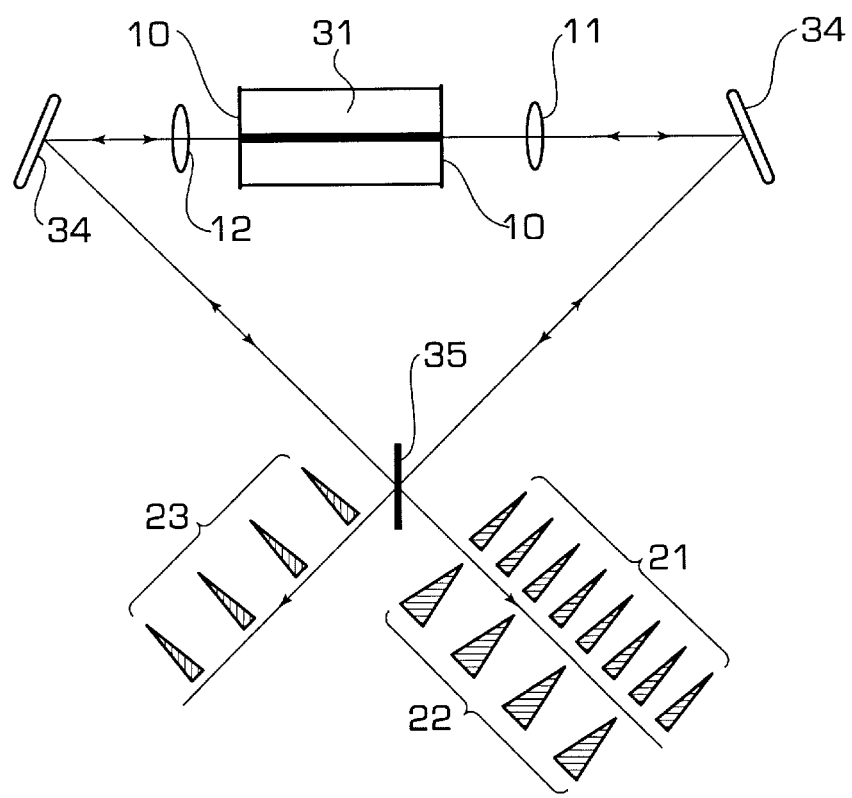
FIG. 4 is a view schematically showing a structure and operation of a conventional optical functional amplifying device.

Next, in order to effect comparison with the optical functional amplifying devices of the embodiments of the present invention described above, a conventional optical functional amplifying device which includes an interferometer wherein a semiconductor laser amplifier is disposed in an optical path is described with reference to FIG. 4.

For the semiconductor laser amplifier 31, a semiconductor laser amplifier of a single electrode structure which only has a gain section is used. Further, an interferometer of the loop type is formed from a beam splitter 35 and two reflecting mirrors 34 which are disposed so as to be positioned at the apexes of a triangle. The semiconductor laser amplifier 31 is interposed between the two reflecting mirrors 34.

An input signal optical pulse train 21 and a gate optical pulse train 22 are introduced into the semiconductor laser amplifier 31 through the beam splitter 35. If attention is paid to the gate optical pulse train 22, it is divided into two trains by the beam splitter 35, and the two gate optical pulse trains are introduced into the semiconductor laser amplifier 31 from the opposite directions to each other with a certain time delay provided therebetween which corresponds to a difference in optical path. As a result, the interference conditions of the interferometer are reversed by a time width corresponding to the time delay. Consequently, the input signal optical pulse train 21 can be cut out with the repetition frequency of the gate optical pulse train 22.

However, in such a construction as described above, the repetition frequency of the gate operation is limited by the life of carriers in the semiconductor laser amplifier 31. Since the carrier life generally is approximately 1 ns, the reliability of the gate operation in a frequency exceeding 10 GHz is deteriorated very much. On the contrary, the optical functional amplifying device according to the present invention exhibits a high reliability of a gate operation even in a frequency region exceeding 100 GHz.

While, in the optical functional amplifying devices of the embodiments of the present invention described above, a semiconductor material of an InGaAsP type is used for the semiconductor laser amplifier 1, the present invention is not limited to the specific material type from a point of view of the principle, and it is apparent that the present invention can be applied to a wide variety of semiconductor materials such as III–V group semiconductors of the AlGaAs type and the GaN type as well as II–VI group semiconductors from which semiconductor laser structures can be produced.

While preferred embodiments of the present invention have been described using specific terms, such description is for illustrative purposes only, and it is to be understood that changes and variations may be made without departing from the spirit or scope of the following claims.

What is claimed is:

1. An optical functional amplifying method, comprising steps of:
   preparing a semiconductor laser amplifier which has a gain section and has a saturable absorber section provided at a portion thereof;
   electrically isolating the saturable gain absorber section from the gain section by a high resistivity;
   coupling, to the laser amplifier, an input signal optical pulse train having a wavelength whose value is set in a proximity of an absorption edge of the saturable absorber section and a gate optical pulse train having a wavelength set shorter than a wavelength of the input signal optical pulse train;
   separating and extracting a signal optical pulse train emitted by the semiconductor laser amplifier from the gate optical pulse train; and
   establishing timing synchronization between the gate optical pulse train and the input signal optical pulse train with a repetition frequency of the gate optical pulse train set to on N-th he basic frequency of the input signal optical pulse train, N being a neutral number.

2. The optical functional amplifying method according to claim 1, further comprising a step of applying a reverse bias voltage to the saturable absorber section.

3. The optical functional amplifying method according to claim 2, wherein:
   the semiconductor laser amplifier has a PIN type layered structure;
   within the semiconductor laser amplifier, the saturable absorber section and the gain section are disposed along an optical path direction;
   the saturable absorber section is disposed in a proximity of one end of the semiconductor laser amplifier; and
   an optical path length of the saturable absorber section is shorter than an optical path length of the gain section.

4. The optical functional amplifying method according to claim 2, wherein the coupling step further comprises:
   introducing the input signal optical pulse train into the semiconductor laser amplifier from the one end side; and
   introducing the gate optical pulse train into the semiconductor laser from an other end side of the semiconductor laser amplifier, and the extracting step further comprises:
obtaining an output signal optical pulse train from the other end side of the semiconductor laser amplifier.

5. An optical functional amplifying device, comprising:
a semiconductor laser amplifier having a gain section and a saturable absorber section,
optical coupling means for coupling an input signal optical pulse train and a gate optical pulse train to the semiconductor laser amplifier, and
selection means for separating and extracting a signal optical pulse train emitted from the semiconductor laser amplifier from the gate optical pulse train,
wherein the saturable absorber section is electrically isolated by a high resistivity from the gain section.

6. The optical functional amplifying device according to claim 5, wherein the selection means is a wavelength selector which extracts the output signal optical pulse train in response to a difference in wavelength between the output signal optical pulse train and the gate optical pulse train.

7. An optical function amplifying device, comprising:
a semiconductor laser amplifier having a gain section and a saturable absorber section;
a first optical coupler for coupling an input signal optical pulse train to the semiconductor laser amplifier,
a second optical coupler for coupling a gate optical pulse train to the semiconductor laser amplifier, and
a selector for separating and extracting a signal optical pulse train emitted from the semiconductor laser amplifier from the gate optical pulse train,
wherein the saturable absorber section is electrically isolated by a high resistivity from the gain section.

8. The optical functional amplifying device according to claim 7, wherein each of the first optical coupler and the second optical coupler comprises an optical lens.

9. The optical functional amplifying device according to claim 7, wherein the selector is a wavelength selector which extracts the output signal optical pulse train in response to a difference in wavelength between the output signal optical pulse train and the gate optical pulse train.

10. The optical functional amplifying device according to claim 5, wherein the semiconductor laser amplifier has a PIN type layer structure, and the saturable absorber section and the gain section are disposed along an optical path direction in the semiconductor laser amplifier.

11. The optical functional amplifying device according to claim 7, wherein the semiconductor laser amplifier has a PIN type layer structure, and the saturable absorber section and the gain section are disposed along an optical path direction in the semiconductor laser amplifier.

12. The optical functional amplifying device according to claim 7, wherein a forward voltage is applied to the gain section and a reverse bias voltage is applied to the saturable absorber section.

13. The optical functional amplifying device according to 11, wherein the saturable absorber section is disposed in a proximity of one end of the semiconductor laser amplifier, and the optical path length of the saturable absorber section is shorter than the optical path length of the gain section.

14. The optical functional amplifying device according to claim 13, wherein the first optical coupler introduces the input signal optical pulse train into the semiconductor laser amplifier from one end adjacent the saturable absorber section and the second optical coupler introduces the gate optical pulse train into the semiconductor laser amplifier from the other end remote from the saturation absorber section.

15. The optical functional amplifying device according to claim 7, wherein the semiconductor laser amplifier has an active layer of a quantum well structure.

16. An operation method utilizing the optical functional amplifying device according to claim 7, comprising:
setting a wavelength of the input signal optical pulse train to a value in a proximity of an absorption edge of the saturable absorber section;
setting a wavelength of the gate optical pulse train to a shorter wavelength than the wavelength of the input signal optical pulse train; and
setting a repetition frequency of the gate optical pulse train to one N-th a basic frequency of the input signal optical pulse train, N being a natural number, whereby timing synchronization is established between the gate optical pulse train and the input signal optical pulse train.

17. An operation method utilizing the optical functional amplifying device according to claim 13, comprising:
setting a wavelength of the input signal optical pulse train to a value in a proximity of an absorption edge of the saturable absorber section;
setting a wavelength of the gate optical pulse train to a shorter wavelength than the wavelength of the input signal optical pulse train;
setting a repetition frequency of the gate optical pulse train to one N-th the basic frequency of the input signal optical pulse train, N being a natural number, whereby timing synchronization is established between the gate optical pulse train and the input signal optical pulse train;
introducing the input signal optical pulse train into the semiconductor laser amplifier from one end adjacent the saturable absorber section; and
introducing the gate optical pulse train into the semiconductor laser amplifier from the other end remote from the saturable absorber section.

18. The optical functional amplifying device according to claim 5, wherein a forward voltage is applied to the gain section and a reverse bias is applied to the saturable absorber section.

* * * * *